(12) United States Patent
Hashimoto et al.

(10) Patent No.: US 9,184,567 B2
(45) Date of Patent: Nov. 10, 2015

(54) QUANTUM CASCADE LASER

(71) Applicant: SUMITOMO ELECTRIC INDUSTRIES, LTD., Osaka-shi, Osaka (JP)

(72) Inventors: Jun-ichi Hashimoto, Yokohama (JP); Takashi Kato, Yokohama (JP); Hiroshi Inada, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 13/738,179

(22) Filed: Jan. 10, 2013

(65) Prior Publication Data

US 2013/0182736 A1 Jul. 18, 2013

(30) Foreign Application Priority Data

Jan. 17, 2012 (JP) ................................ 2012-007111

(51) Int. Cl.
*H01S 5/30* (2006.01)
*H01S 5/343* (2006.01)
*H01S 5/20* (2006.01)
*H01S 5/227* (2006.01)
(Continued)

(52) U.S. Cl.
CPC ................. *H01S 5/343* (2013.01); *B82Y 20/00* (2013.01); *H01S 5/2031* (2013.01);
(Continued)

(58) Field of Classification Search
CPC ..... H01S 5/3401; H01S 5/3402; H01S 5/223; H01S 5/2231; H01S 5/2232; H01S 5/2234; H01S 5/2235; H01S 5/2237; H01S 5/2238; H01S 5/227; H01S 5/2272; H01S 5/2275; H01S 5/2277

USPC .................................... 372/45.012, 46.011
See application file for complete search history.

(56) References Cited

U.S. PATENT DOCUMENTS 5,325,385 A * 6/1994 Kasukawa et al. ......... 372/46.01
6,162,655 A * 12/2000 Johnson et al. .................. 438/31
(Continued)

FOREIGN PATENT DOCUMENTS

JP 2003-526214 9/2003
WO WO 03049243 A2 * 6/2003 ................ H01S 5/34
WO WO 2011084201 A1 * 7/2011 ................ H01S 5/30

OTHER PUBLICATIONS

Lee et al., "Thermal Analysis of Buried Heterostructure Quantum Cascade Lasers for Long-Wavelength Infrared Emission Using 2D Anisotropic Heat-Dissipation Model," 2009, Phys. Status Solidi A, 206, 356-362.*

*Primary Examiner* — Joshua King
(74) *Attorney, Agent, or Firm* — Smith, Gambrell & Russell LLP

(57) ABSTRACT

A quantum cascade laser includes a substrate having a conductivity type, substrate having a first region, a second region, and a third region; a semiconductor lamination provided on a principal surface of the substrate, the semiconductor lamination including a mesa stripe section provided on the second region, an upper cladding layer having the same conductivity type as the substrate, a first burying layer, and a second burying layer, the mesa stripe section including a core layer; and an electrode provided on the semiconductor lamination. The first and second burying layers are provided on the first and third regions and on both side faces of the mesa stripe section. The upper cladding layer is provided on the mesa stripe section, the first burying layer, and the second burying layer. The first and second burying layers include a first and second semi-insulating semiconductor regions comprised of a semi-insulating semiconductor material.

10 Claims, 10 Drawing Sheets

(51) Int. Cl.
*H01S 5/34* (2006.01)
*B82Y 20/00* (2011.01)
*H01S 5/024* (2006.01)
*H01S 5/32* (2006.01)
*H01S 5/22* (2006.01)

(52) U.S. Cl.
CPC ............ *H01S 5/2275* (2013.01); *H01S 5/3402* (2013.01); *H01S 5/02461* (2013.01); *H01S 5/2224* (2013.01); *H01S 5/3211* (2013.01)

(56) References Cited

U.S. PATENT DOCUMENTS

| | | | |
|---|---|---|---|
| 6,463,088 B1 * | 10/2002 | Baillargeon et al. | 372/46.01 |
| 2007/0280319 A1 * | 12/2007 | Sekiguchi et al. | 372/45.01 |
| 2008/0219312 A1 * | 9/2008 | Sugiyama et al. | 372/46.01 |
| 2009/0052488 A1 * | 2/2009 | Sugiyama et al. | 372/45.012 |
| 2009/0213890 A1 * | 8/2009 | Patel et al. | 372/45.012 |
| 2013/0329761 A1 * | 12/2013 | Hashimoto et al. | 372/45.012 |

* cited by examiner

*Fig.2*
(a)
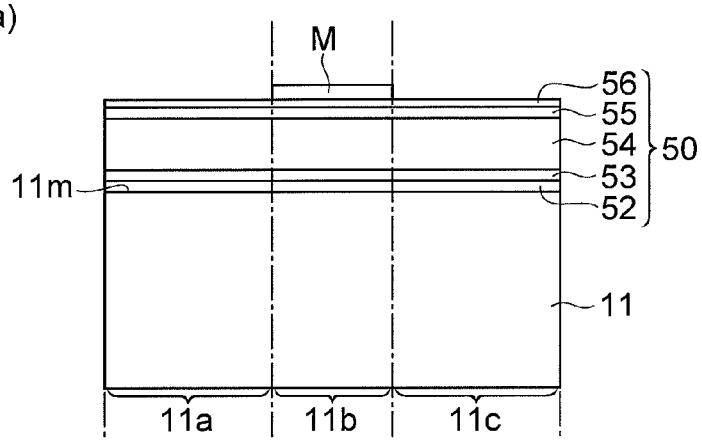
(b)
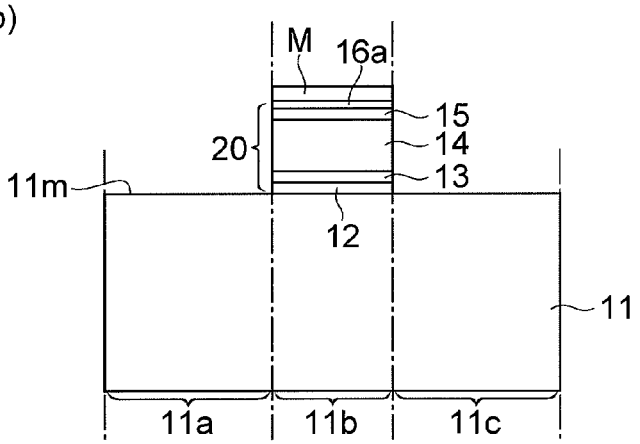
(c)
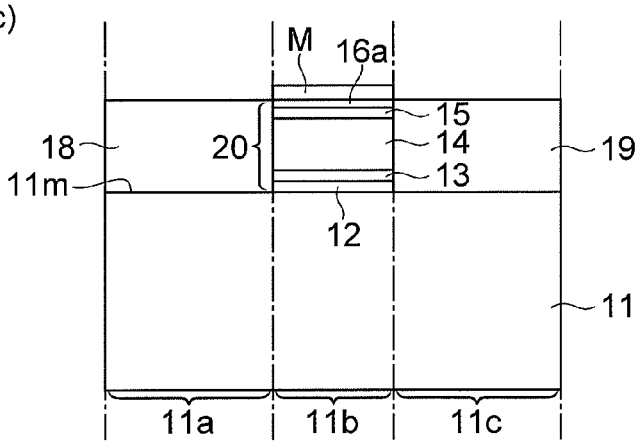

Fig.4
(a)
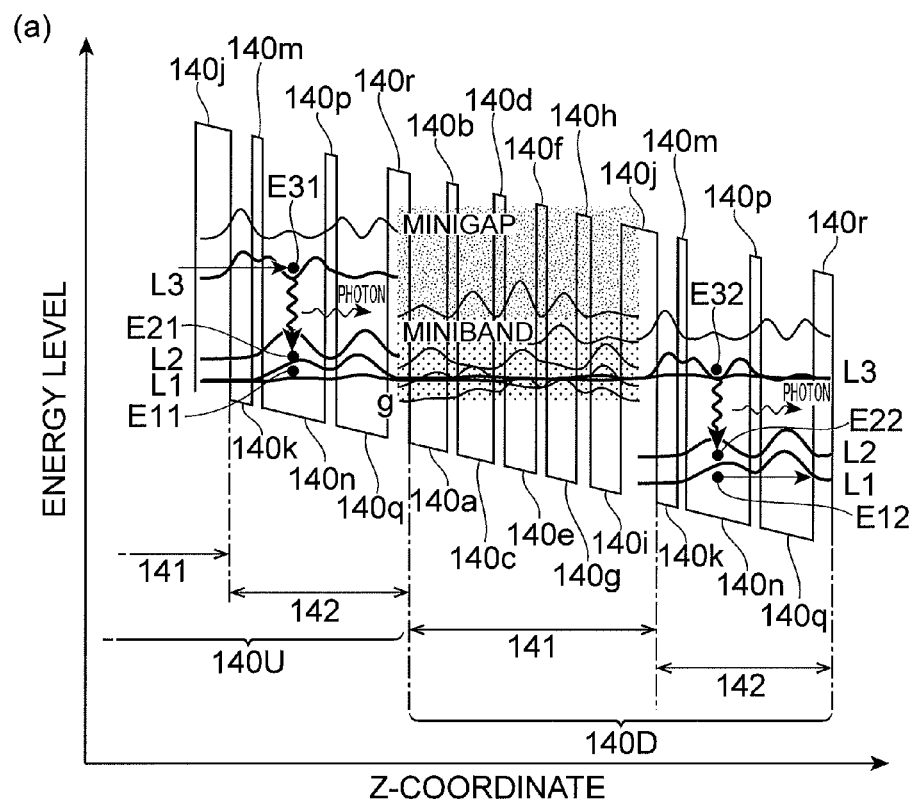
(b)
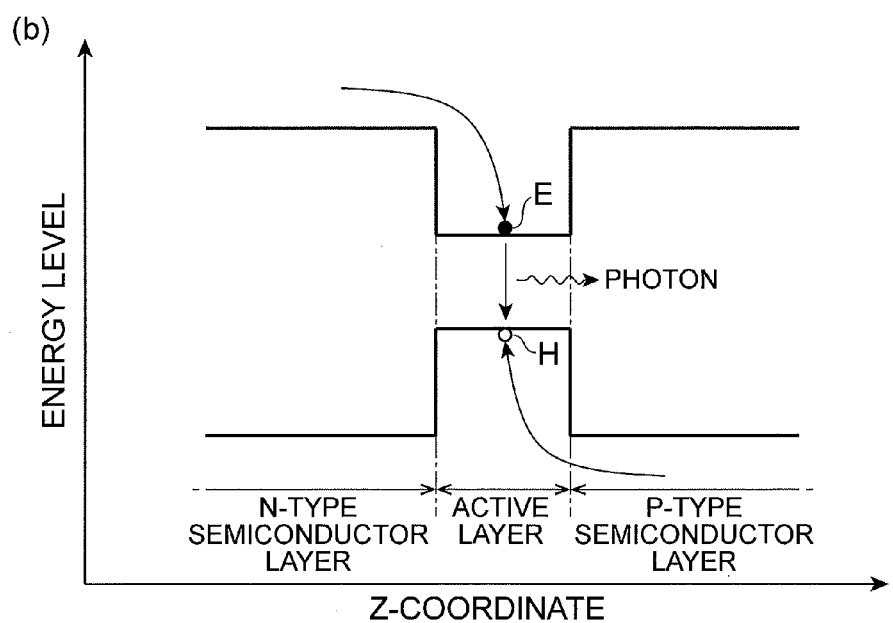

QUANTUM CASCADE LASER

BACKGROUND OF THE INVENTION

1. Field of the Invention

The present invention relates to a quantum cascade laser.

2. Related Background Art

A quantum cascade laser (QCL: Quantum Cascade Laser) is known as a semiconductor optical device. This quantum cascade laser is a promising device as a compact and low-cost light source that can be used in fields such as analysis of environmental gas, medical application, and industrial processing. As a current confinement structure of the quantum cascade laser, there is, for example, a buried heterostructure (BH: Buried Heterostructure) described in Patent Literature 1 below.

A manufacturing process of this buried heterostructure will be described. First, semiconductor epitaxial layers are grown on a semiconductor substrate, and thereafter, at least a contact layer, an upper cladding layer, and a core layer are etched to form a mesa waveguide in a region to be an optical waveguide in the center of the device. Thereafter, side walls of the mesa structure are buried by current blocking layers comprised of a high-resistance semi-insulating semiconductor to produce the current confinement structure.

CITATION LIST

Patent Literature

Patent Literature 1: Published Japanese Translation of PCT Application No. 2003-526214

SUMMARY OF THE INVENTION

Incidentally, in a semiconductor laser device of InGaAsP/InP-based materials used as a light source for optical communication, the thickness of the core layer is not more than 0.2 µm and the thickness of the upper cladding layer is also about 1 to 2 µm. On the other hand, in the case of the quantum cascade laser, the thickness of the core layer is about 1 to 2 µm and the thickness of the upper cladding layer is also large, about 2 to 4 µm. Therefore, the thicknesses of the core layer and the upper cladding layer are considerably larger in the quantum cascade laser than those in the semiconductor laser device. Furthermore, light emission mechanisms are different between the semiconductor laser device using the pn junction and the quantum cascade laser, and in the case of the quantum cascade laser, an electric field to be applied to this core layer needs to be uniform in the thickness direction and in-plane directions (directions normal to the thickness direction), in order to improve the emission characteristics.

In the quantum cascade laser described in Patent Literature 1 above, the semiconductor layers from the contact layer to the core layer need to be etched in formation of the mesa waveguide. Since the core layer and upper cladding layer are thicker in the quantum cascade laser than in the semiconductor laser device as described above, the thickness of the semiconductor layers from the contact layer to the core layer is large.

For this reason, influence of side etching cannot be ignored in execution of the etching for formation of the mesa waveguide and a cross-sectional shape of the mesa waveguide becomes a shape deviating from a rectangular shape. Therefore, further improvement is desired in uniformity of the electric field in the core layer.

A quantum cascade laser according to the present invention includes (a) a substrate having a conductivity type, the substrate having a principal surface and a back surface opposite to the principal surface, substrate having a first region, a second region, and a third region arranged in order along a direction perpendicular to a normal axis to the principal surface; (b) a semiconductor lamination provided on the principal surface of the substrate, the semiconductor lamination including a mesa stripe section provided on the second region, an upper cladding layer having the same conductivity type as the substrate, a first burying layer, and a second burying layer, the mesa stripe section including a core layer for emission of light in the quantum cascade laser; (c) a first electrode provided on the semiconductor lamination; and (d) a second electrode provided on the back surface of the substrate. The first burying layer is provided on the first region and one side face of the mesa stripe section. The second burying layer is provided on the third region and other side face of the mesa stripe section. The upper cladding layer is provided on the mesa stripe section, the first burying layer, and the second burying layer. The first burying layer includes a first semi-insulating semiconductor region comprised of a semi-insulating semiconductor material. In addition, the second burying layer includes a second semi-insulating semiconductor region comprised of a semi-insulating semiconductor material.

In this quantum cascade laser, the upper cladding layer is provided on the mesa stripe section including the core layer, on the first burying layer provided so as to bury one side face of the mesa stripe section, and on the second burying layer provided so as to bury the other side face of the mesa stripe section. This configuration eliminates a need for the mesa stripe section to include the contact layer and the upper cladding layer and thus reduces the height of the mesa stripe section. For this reason, the side faces of the mesa stripe section are less etched by side etching during the formation of the mesa stripe section by etching and the cross-sectional shape of the mesa stripe section becomes closer to the rectangular shape. As a consequence, when a voltage is applied between the first electrode and the second electrode, uniformity of the electric field applied to the core layer is improved when compared to that in the quantum cascade laser of the buried heterostructure with the mesa section including the core layer and the upper cladding layer.

In the quantum cascade laser, the first semi-insulating semiconductor region may have a first side portion in contact with the core layer and a first bottom portion provided on the substrate, and the second semi-insulating semiconductor region may have a second side portion in contact with the core layer and a second bottom portion provided on the substrate. In this case, since the first semi-insulating semiconductor region has the first side portion in contact with the core layer and the first bottom portion provided on the substrate, entrance of electrons into the first burying layer is suppressed well. Similarly, since the second semi-insulating semiconductor region has the second side portion in contact with the core layer and the second bottom portion provided on the substrate, entrance of electrons into the second burying layer is suppressed well. As a consequence, an electric current is successfully confined in the mesa stripe section.

In the quantum cascade laser, the first burying layer may further have a third semi-insulating semiconductor region comprised of a semi-insulating semiconductor material different from the semi-insulating semiconductor material forming the first semi-insulating semiconductor region, and the second burying layer may further have a fourth semi-insulating semiconductor region comprised of a semi-insulating semiconductor material different from the semi-insulating semiconductor material forming the second semi-insulating semiconductor region. In this case, the first burying layer and the second burying layer can be comprised of the combinations of semi-insulating semiconductor materials different in properties such as the refractive index, bandgap, and thermal conduction, so as to increase degrees of freedom for design. For this reason, it becomes feasible to improve the characteristics of the quantum cascade laser.

In the quantum cascade laser, the first semi-insulating semiconductor region may have a bandgap higher than a bandgap of the third semi-insulating semiconductor region, and the second semi-insulating semiconductor region may have a bandgap higher than a bandgap of the fourth semi-insulating semiconductor region. In this case, energy barriers against electrons increase at interfaces between the neighboring layers and each of the first burying layer and the second burying layer, when compared to those in a configuration wherein the first burying layer and the second burying layer have respective single semi-insulating semiconductor regions with a low bandgap, and therefore, the entrance of electrons from the neighboring layers into the first burying layer and the second burying layer is further suppressed. As a consequence, the electric current is more strongly confined in the mesa stripe section, and therefore it becomes feasible to improve the lasing property of the quantum cascade laser.

In the quantum cascade laser, the first burying layer may further have a first semiconductor region comprised of an undoped or n-type semiconductor material, and the second burying layer may further have a second semiconductor region comprised of an undoped or n-type semiconductor material. In the mid-infrared region, the optical absorption loss in the semiconductor region comprised of the undoped or n-type semiconductor material is smaller than that in the semi-insulating semiconductor region. For this reason, when the first burying layer and the second burying layer further have the respective semiconductor regions comprised of the undoped or n-type semiconductor material, the optical absorption loss can be reduced in the first burying layer and the second burying layer. As a consequence, it becomes feasible to improve the lasing property of the quantum cascade laser. Furthermore, the thermal conductivity of the undoped semiconductor material is higher than that of the semi-insulating semiconductor material. For this reason, when the first burying layer and the second burying layer further have the respective semiconductor regions comprised of the undoped semiconductor material, heat dissipation from the core layer is improved. As a consequence, it becomes feasible to improve the temperature characteristic of the quantum cascade laser.

In the quantum cascade laser, the first semi-insulating semiconductor region may have a bandgap higher than a bandgap of the first semiconductor region, and the second semi-insulating semiconductor region may have a bandgap higher than a bandgap of the second semiconductor region. In this case, energy barriers against electrons increase at interfaces between the neighboring layers and each of the first burying layer and the second burying layer, when compared to those in the configuration wherein the first burying layer and the second burying layer have their respective single semi-insulating semiconductor regions with a low bandgap, and therefore, the entrance of electrons from the neighboring layers into the first burying layer and the second burying layer is further suppressed. As a consequence, the electric current is confined more strongly in the mesa stripe section, and therefore it becomes feasible to improve the lasing property of the quantum cascade laser.

In the quantum cascade laser, the first semi-insulating semiconductor region and the second semi-insulating semiconductor region may have a higher resistance to electrons than a resistance to holes. In this case, since the first semi-insulating semiconductor region and the second semi-insulating semiconductor region have the high resistance to electrons as carriers, the electric current is prevented from flowing through the first burying layer and the second burying layer. As a consequence, the electric current is confined in the mesa stripe section and it is therefore feasible to improve the lasing property of the quantum cascade laser.

In the quantum cascade laser, the first semi-insulating semiconductor region and the second semi-insulating semiconductor region may be comprised of InP or AlInAs doped with a transition metal selected from the group consisting of Fe, Ti, Cr, and Co. In this case, when InP or AlInAs is doped with the transition metal, InP or AlInAs becomes semi-insulating. Since semi-insulating InP or AlInAs has a high resistance to electrons, it can prevent the electric current from flowing through the first burying layer and the second burying layer. As a consequence, the electric current is confined in the mesa stripe section and it is therefore feasible to improve the lasing property of the quantum cascade laser.

In the quantum cascade laser, the core layer may have a plurality of active layers and a plurality of injection layers to inject carries into the active layers, the active layers and the injection layers being alternately arranged. When the injection layers are laid between the active layers, electrons are continuously and smoothly transferred between neighboring active layers so as to efficiently cause emission of light by intersubband transitions in the conduction bands. As a consequence, it becomes feasible to improve the lasing property of the quantum cascade laser.

In the quantum cascade laser, each of the active layers and the injection layers may be comprised of a superlattice series of GaInAs and AlInAs. This superlattice series enables emission of light in the mid-infrared region by the intersubband transitions in the conduction bands in the active layers.

In the quantum cascade laser, the upper cladding layer may be comprised of InP with the conductivity type of n-type. Since InP has high thermal conductivity, the use of InP for the cladding layer improves heat dissipation from the core layer. As a consequence, it becomes feasible to improve the temperature characteristic of the quantum cascade laser.

In the quantum cascade laser, the substrate may be comprised of InP with the conductivity type of n-type.

The lattice constants of the semiconductor lamination are close to those of InP. For this reason, the use of the InP substrate enables good crystal growth of the semiconductor lamination.

BRIEF DESCRIPTION OF THE DRAWINGS

FIG. 2 is a drawing showing a manufacturing process of the quantum cascade laser shown in FIG. 1.

FIG. 4 is (a) a drawing for explaining an emission mechanism of the quantum cascade laser shown in FIG. 1 and (b) a drawing for explaining an emission mechanism of a semiconductor laser device using a pn junction.

DESCRIPTION OF THE PREFERRED EMBODIMENTS

Embodiments of the present invention will be described below in detail with reference to the accompanying drawings. The same elements will be denoted by the same reference signs as much as possible.

Figure 1:
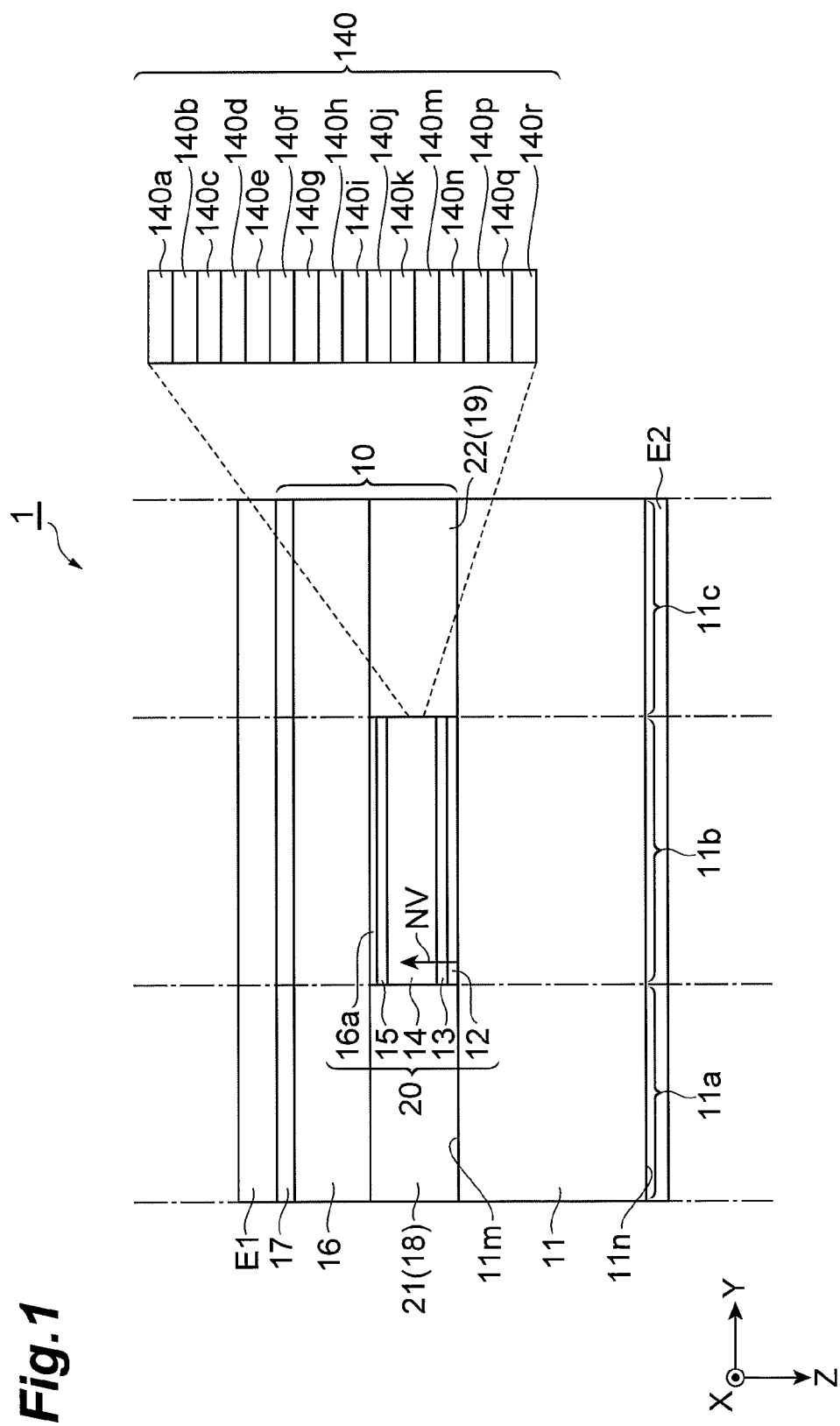
FIG. 1 is a drawing schematically showing a structure of a quantum cascade laser according to an embodiment of the present invention.

FIG. 1 is a drawing schematically showing a structure of a quantum cascade laser according to an embodiment of the present invention. The quantum cascade laser 1 is a quantum cascade laser device having the current confinement structure of the buried heterostructure and can lase in the mid-infrared wavelength region of about 3 to 20 µm. As shown in FIG. 1, the quantum cascade laser 1 is provided with a semiconductor substrate 11 (substrate), a semiconductor lamination 10, an upper electrode E1 (first electrode), and a lower electrode E2 (second electrode).

The semiconductor substrate 11 is comprised, for example, of InP with a predetermined conductivity type (for example, an n-type) and has the thickness, for example, in the range of about 100 to 200 µm. This semiconductor substrate 11 has a principal surface 11m, and a back surface 11n opposite to the principal surface 11m. The semiconductor substrate 11 has a first region 11a, a second region 11b, and a third region 11c arranged in order along a direction ("width direction" below) perpendicular to a normal axis NV to the principal surface 11m. Each of the first region 11a, second region 11b, and third region 11c extends along another direction perpendicular to a plane defined by the normal axis NV to the principal surface 11m and the width direction. The semiconductor substrate 11 may be a substrate in which a semiconductor layer such as an InP buffer layer is further laid on a semiconductor substrate.

The semiconductor lamination 10 is provided on the principal surface 11m of the semiconductor substrate 11. The semiconductor lamination 10 includes a mesa stripe section 20, an upper cladding layer 16, a contact layer 17, a first burying layer 18, and a second burying layer 19. The mesa stripe section 20 is provided on the second region 11b and extends along the other direction. The mesa stripe section 20 includes a lower cladding layer 12, a lower optical confinement layer 13, a core layer 14, an upper optical confinement layer 15, and a cap layer 16a. These lower cladding layer 12, lower optical confinement layer 13, core layer 14, upper optical confinement layer 15, and cap layer 16a are arranged in order along the normal axis NV of the semiconductor substrate 11. The lower cladding layer 12 is provided on the principal surface 11m of the semiconductor substrate 11. The lower cladding layer 12 is comprised, for example, of n-type InP and has the thickness, for example, in the range of about 0.1 to 0.5 µm. The lower optical confinement layer 13 is provided on the lower cladding layer 12. The lower optical confinement layer 13 is comprised, for example, of n-type GaInAs and has the thickness, for example, in the range of about 0.1 to 0.5 µm.

The core layer 14 is located between the lower optical confinement layer 13 and the upper optical confinement layer 15. The core layer 14 is a layer for emission of light in the quantum cascade laser 1 and has a cascade structure in which a plurality of active layers as light-emitting regions, and a plurality of injection layers to inject electrons as carriers into the active layers are alternately arranged. Each of these active layers and injection layers is comprised of a superlattice series comprised of GaInAs and AlInAs. The thickness of the core layer 14 is, for example, in the range of about 1 to 2 µm. The core layer 14 has a structure in which unit laminate bodies 140 are laid in multiple stages (e.g., 30 units). Each unit laminate body 140 is comprised, for example, of a superlattice series in which first semiconductor layer 140a to sixteenth semiconductor layer 140r described below are connected in order. This core layer 14 lases in an 8-µm band. In the unit laminate body 140 the eleventh semiconductor layer 140k to sixteenth semiconductor layer 140r correspond to the active layer and, the first semiconductor layer 140a to tenth semiconductor layer 140j to the injection layer.

[Configuration Example of Unit Laminate Body 140]

First semiconductor layer 140a: undoped GaInAs, thickness 4.0 nm.

Second semiconductor layer 140b: undoped AlInAs, thickness 1.1 nm.

Third semiconductor layer 140c: n-type GaInAs, thickness 3.6 nm, doping amount $2\times10^{17}$ cm$^{-3}$.

Fourth semiconductor layer 140d: n-type AlInAs, thickness 1.2 nm, doping amount $2\times10^{17}$ cm$^3$.

Fifth semiconductor layer 140e: n-type GaInAs, thickness 3.2 nm, doping amount $2\times10^{17}$ cm$^{-3}$.

Sixth semiconductor layer 140f: undoped AlInAs, thickness 1.2 nm.

Seventh semiconductor layer 140g: undoped GaInAs, thickness 3.0 nm.

Eighth semiconductor layer 140h: undoped AlInAs, thickness 1.6 nm.

Ninth semiconductor layer 140i: undoped GaInAs, thickness 3.0 nm.

Tenth semiconductor layer 140j: undoped AlInAs, thickness 3.8 nm.

Eleventh semiconductor layer 140k: undoped GaInAs, thickness 2.1 nm.

Twelfth semiconductor layer 140m: undoped AlInAs, thickness 1.2 nm.

Thirteenth semiconductor layer 140n: undoped GaInAs, thickness 6.5 nm.

Fourteenth semiconductor layer 140p: undoped AlInAs, thickness 1.2 nm.

Fifteenth semiconductor layer 140q: undoped GaInAs, thickness 5.3 nm.

Sixteenth semiconductor layer 140r: undoped AlInAs, thickness 2.3 nm.

The upper optical confinement layer 15 is provided on the core layer 14. The upper optical confinement layer 15 is comprised, for example, of n-type GaInAs and has the thickness, for example, in the range of about 0.1 to 0.5 µm. The cap layer 16a is provided on the upper optical confinement layer 15. The cap layer 16a is comprised, for example, of n-type InP and has the thickness, for example, in the range of about 0.1 to 0.5 µm.

The first burying layer 18 is laid on the first region 11a so as to bury one side face of the mesa stripe section 20. The first burying layer 18 includes a first semi-insulating semiconductor region 21 comprised of a semi-insulating semiconductor material and the thickness of the first burying layer 18 is approximately the same as the height of the mesa stripe section 20. The second burying layer 19 is laid on the third region 11c so as to bury the other side face of the mesa stripe section 20. The second burying layer 19 includes a second semi-insulating semiconductor region 22 comprised of a semi-insulating semiconductor material and the thickness of the second burying layer 19 is approximately the same as the height of the mesa stripe section 20.

The semi-insulating semiconductor material making up the first semi-insulating semiconductor region 21 and the second semi-insulating semiconductor region 22 is comprised, for example, of a semiconductor such as InP or AlInAs. This semiconductor becomes semi-insulating when doped with a transition metal, for example, one selected from the group consisting of Fe, Ti, Cr, and Co. The transition metal to be used as a dopant can form a deep level to trap electrons, in the forbidden band. Since the first semi-insulating semiconductor region 21 and second semi-insulating semiconductor region 22 doped with the transition metal have the resistance to electrons higher than that to holes and have a high resistivity of not less than $10^5$ Ωcm to an electric current of electrons as carriers (electron current), the first burying layer 18 and second burying layer 19 function as current blocking layers against the electron current flowing inside the quantum cascade laser 1.

The upper cladding layer 16 is laid on the mesa stripe section 20, first burying layer 18, and second burying layer 19. The upper cladding layer 16 is comprised, for example, of n-type InP and has the thickness, for example, in the range of about 2 to 4 μm. The contact layer 17 is laid on the upper cladding layer 16. The contact layer 17 is comprised, for example, of n-type GaInAs and has the thickness, for example, in the range of about 0.1 to 1 μm.

The upper electrode E1 is disposed on the contact layer 17. The upper electrode E1 is comprised, for example, of Ti/Au and has the following thickness: for example, the Ti layer in the range of about 10 to 100 nm and the Au layer in the range of about 5 to 7 μm. The lower electrode E2 is laid on the back surface 11n of the semiconductor substrate 11. The lower electrode E2 is comprised, for example, of Ti/Au and has the following thickness: for example, the Ti layer in the range of about 10 to 100 nm and the Au layer in the range of about 0.1 to 1 μm.

Figure 3:
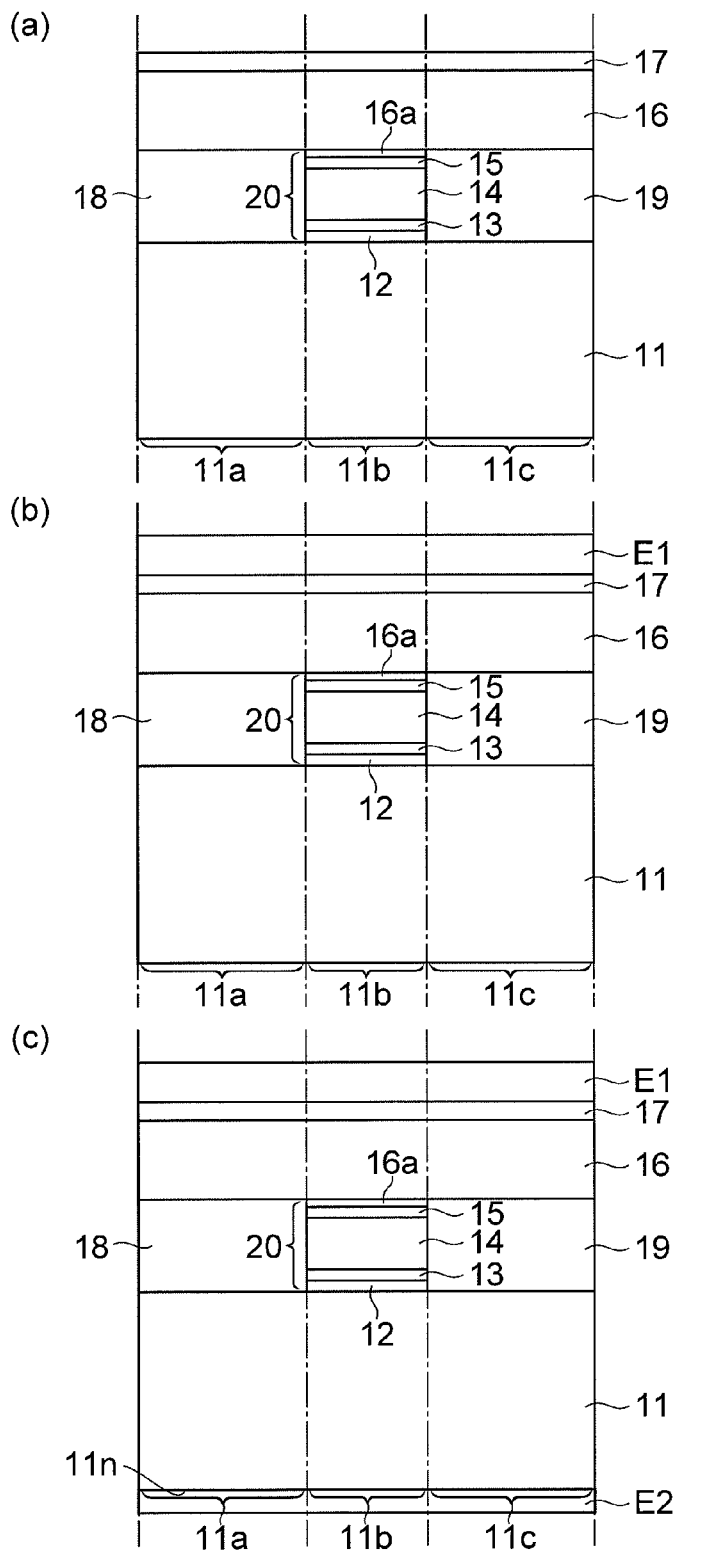
FIG. 3 is a drawing showing the manufacturing process subsequent to FIG. 2.

Subsequently, a method for manufacturing the quantum cascade laser 1 will be described. FIGS. 2 and 3 are drawings showing a manufacturing procedure of the quantum cascade laser 1. As shown in (a) of FIG. 2, first, a semiconductor lamination 50 is grown on the principal surface 11m of the semiconductor substrate 11. Specifically, a lower cladding layer 52, a lower optical confinement layer 53, a core layer 54, an upper optical confinement layer 55, and a cap layer 56 are grown in order on the principal surface 11m of the semiconductor substrate 11 (first growth step). In this first growth step, each of the foregoing layers is grown using a generally-used crystal growth system for III-V Group compound semiconductors, e.g., such as OMVPE (Organometallic Vapor Phase Epitaxy) or MBE (Molecular Beam Epitaxy). Thereafter, a dielectric mask M for formation of the mesa stripe section 20 is formed in a region of the cap layer 56 above the second region 11b (mask forming step). This dielectric mask M is comprised of a common dielectric material used in a semiconductor process, such as silicon nitride (e.g., SiN) or silicon oxide (e.g., SiO$_2$).

Next, as shown in (b) of FIG. 2, the semiconductor lamination 50 on the first region 11a and on the third region 11c not covered by the dielectric mask M is etched down to the principal surface 11m of the semiconductor substrate 11, to form the mesa stripe section 20 on the second region 11b (mesa forming step). This etching to be employed is wet etching or dry etching. The above showed the example of etching the semiconductor lamination 50 on the first region 11a and on the third region 11c down to the principal surface 11m, but it is noted that it is sufficient to etch the semiconductor lamination 50 at least down to the principal surface of the lower cladding layer 52 or that the semiconductor lamination 50 may be etched to a halfway point of the lower cladding layer 52 as occasion may demand.

Thereafter, the burying layers are grown without removing the dielectric mask M. At this time, as shown in (c) of FIG. 2, the first burying layer 18 is grown on the first region 11a and the second burying layer 19 on the third region 11c, without crystal growth on the dielectric mask M (second growth step). This second growth step results in obtaining the buried heterostructure in which the two side faces of the mesa stripe section 20 are buried by the first burying layer 18 and the second burying layer 19. Thereafter, the dielectric mask M is removed (mask removing step). Then, as shown in (a) of FIG. 3, the upper cladding layer 16 and the contact layer 17 are grown in order on the mesa stripe section 20, first burying layer 18, and second burying layer 19 (third growth step).

Next, as shown in (b) of FIG. 3, the upper electrode E1 is formed on the contact layer 17 by evaporation or sputtering. Thereafter, for easier cleavage, the semiconductor substrate 11 is made thinner to a thickness thin enough to cleave (e.g., about 100 to 200 μm), for example, by polishing the back surface 11n of the semiconductor substrate 11. Furthermore, as shown in (c) of FIG. 3, the lower electrode E2 is formed on the back surface 11n by evaporation or sputtering (electrode forming step). The quantum cascade laser 1 is fabricated as described above.

In the quantum cascade laser 1, as described above, the mesa stripe section 20 including the core layer 14 is provided on the principal surface 11m of the semiconductor substrate 11 in the device central region and the first burying layer 18 and second burying layer 19 including the regions comprised of the semi-insulating semiconductor material are provided so as to bury the two side faces of the mesa stripe section 20. Furthermore, the upper cladding layer 16 is provided across the entire surface of the device on the mesa stripe section 20, the first burying layer 18, and the second burying layer 19 and the contact layer 17 is provided on the upper cladding layer 16. If guided light can be fully confined in the core layer 14, the lower optical confinement layer 13 and the upper optical confinement layer 15 may be omitted. If good ohmic contact is achieved between the upper cladding layer 16 and the upper electrode E1, the contact layer 17 may be omitted. Furthermore, if the semiconductor substrate 11 can be used as lower cladding layer, the lower cladding layer 12 may be omitted.

The below will describe the emission mechanism of the quantum cascade laser 1. (a) of FIG. 4 is a drawing for explaining the emission mechanism of the quantum cascade laser 1, and (b) a drawing for explaining the emission mechanism of the semiconductor laser device using the pn junction. In (a) of FIG. 4, the horizontal axis represents the thickness direction of the core layer 14 and the vertical axis energy level. In the same drawing, two neighboring unit laminate bodies 140U, 140D are shown out of the plurality of unit laminate bodies 140 forming the core layer 14, and there are shown subband states in the conduction bands, for example, with application of a uniform electric field of 45 kV/cm to the core layer 14. In (b) of FIG. 4, the horizontal axis represents the thickness direction of the active layer and the vertical axis energy level.

As shown in (a) of FIG. 4, the unit laminate body 140 consists of the injection layer 141 and the active layer 142. The injection layer 141 has a plurality of quantum well layers (first semiconductor layer 140$a$, third semiconductor layer 140$c$, fifth semiconductor layer 140$e$, seventh semiconductor layer 140$g$, and ninth semiconductor layer 140$i$) and a plurality of quantum barrier layers (second semiconductor layer 140$b$, fourth semiconductor layer 140$d$, sixth semiconductor layer 140$f$, eighth semiconductor layer 140$h$, and tenth semiconductor layer 140$j$). The active layer 142 has a plurality of quantum well layers (eleventh semiconductor layer 140$k$, thirteenth semiconductor layer 140$n$, and fifteenth semiconductor layer 140$q$) and a plurality of quantum barrier layers (twelfth semiconductor layer 140$m$, fourteenth semiconductor layer 140$p$, and sixteenth semiconductor layer 140$r$). The active layer 142 has energy levels of first level L1, second level L2, and third level L3 in order from the lowest.

In the quantum cascade laser 1, the structure of the core layer 14 is designed on the assumption that a uniform electric field is applied to the core layer 14. For example, when the uniform electric field of 45 kV/cm is applied to the core layer 14, an electron from the injection layer 141 of the upper-stage unit laminate body 140U is injected into the third level L3 in the active layer 142 of the upper-stage unit laminate body 140U. In the active layer 142, the electron E31 at this third level L3 transits to the second level L2 to be an electron E21. According to this transition, a photon is generated at the wavelength corresponding to the energy level difference between the third level L3 and the second level L2. The electron E21 at the second level L2 transits to the first level L1 to be an electron E11. Then the electron E11 at the first level L1 migrates through the injection layer 141 of the lower-stage unit laminate body 140D to be smoothly injected into the third level L3 in the active layer 142 of the lower-stage unit laminate body 140D. The electron E32 at this third level L3 transits to the second level L2, as the electron E31 did, to be an electron E22. According to this transition, a photon is generated at a wavelength corresponding to an energy level difference between the third level L3 and the second level L2. The electron E22 at the second level L2 transits to the first level L1 to be an electron E12. Then the electron E12 at the first level L1 further migrates through the injection layer 141 of the unit laminate body 140 at a still lower stage to be smoothly injected into the third level L3 in the active layer 142 of the unit laminate body 140 at the still lower stage.

Such electron injection and transitions are repeatedly carried out in each of the unit laminate bodies 140 to generate photons in a cascade manner in the core layer 14. It is noted herein that the energy levels of the second level L2 and the third level L3 and an energy gap between them are determined by material compositions and thicknesses of the respective quantum well layers in the active layer 142, material compositions and thicknesses of the respective quantum barrier layers, and the applied electric field assumed to be uniform. It should be particularly noted that the energy levels of the second level L2 and the third level L3 and the energy gap between them are determined by the applied electric field assumed to be uniform. In the quantum cascade laser, therefore, degradation of uniformity of the electric field applied to the core layer 14 must result in variation of the subband states from the designed values, which makes implementation of a designed lasing property difficult.

On the other hand, in the case of the semiconductor laser device using the pn junction, as shown in (b) of FIG. 4, when a forward voltage is applied between the upper electrode and the lower electrode, an electron E in the conduction band transits to the valence band to be recombined with a hole H in the valence band to emit a photon. Namely, the emission of light in the semiconductor laser device is caused by recombination according to injection of hole H from the p-type semiconductor layer and injection of electron E from the n-type semiconductor layer. The electric field is applied to the active layer in the forward bias direction to the amount that is necessary to reduce sufficiently an energy barrier (built-in potential) against these carriers formed in the pn junction region composed of the p-type semiconductor layer-active layer-n-type semiconductor layer, and to inject these carriers into the active layer. In this case, the electric field applied to the active layer does not have to be uniform and it is sufficient to apply the electric field in the intensity enough to reduce the built-in potential so that carriers can be smoothly injected into the active layer. As discussed above, the emission mechanism of the quantum cascade laser is different from that of the semiconductor laser device using the pn junction. For the reason of the difference between the emission mechanisms, the uniformity of the electric field applied to the active layer is not demanded in the case of the semiconductor laser device using the pn junction, whereas the uniformity of the electric field applied to the core layer is desired to improve in the quantum cascade laser.

Figure 5:
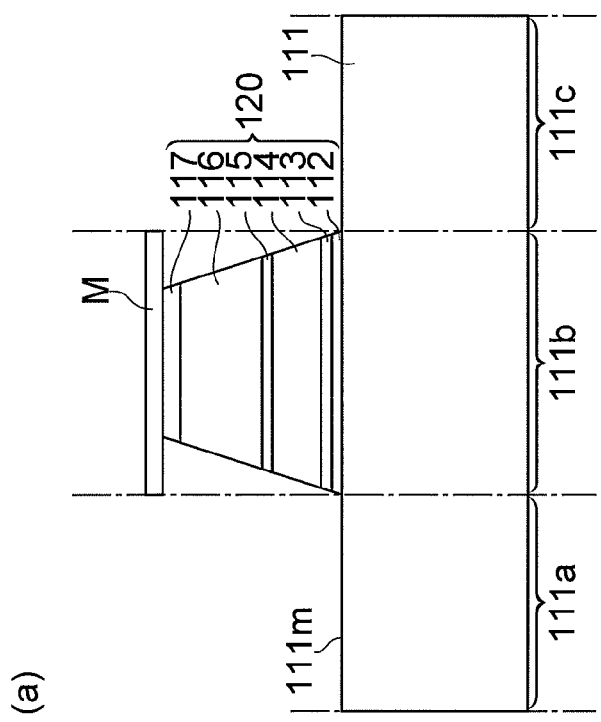
FIG. 5 is (a) a drawing schematically showing a mesa structure of a quantum cascade laser according to a comparative example and (b) a drawing schematically showing a mesa structure of the quantum cascade laser shown in FIG. 1.
Figure 6:
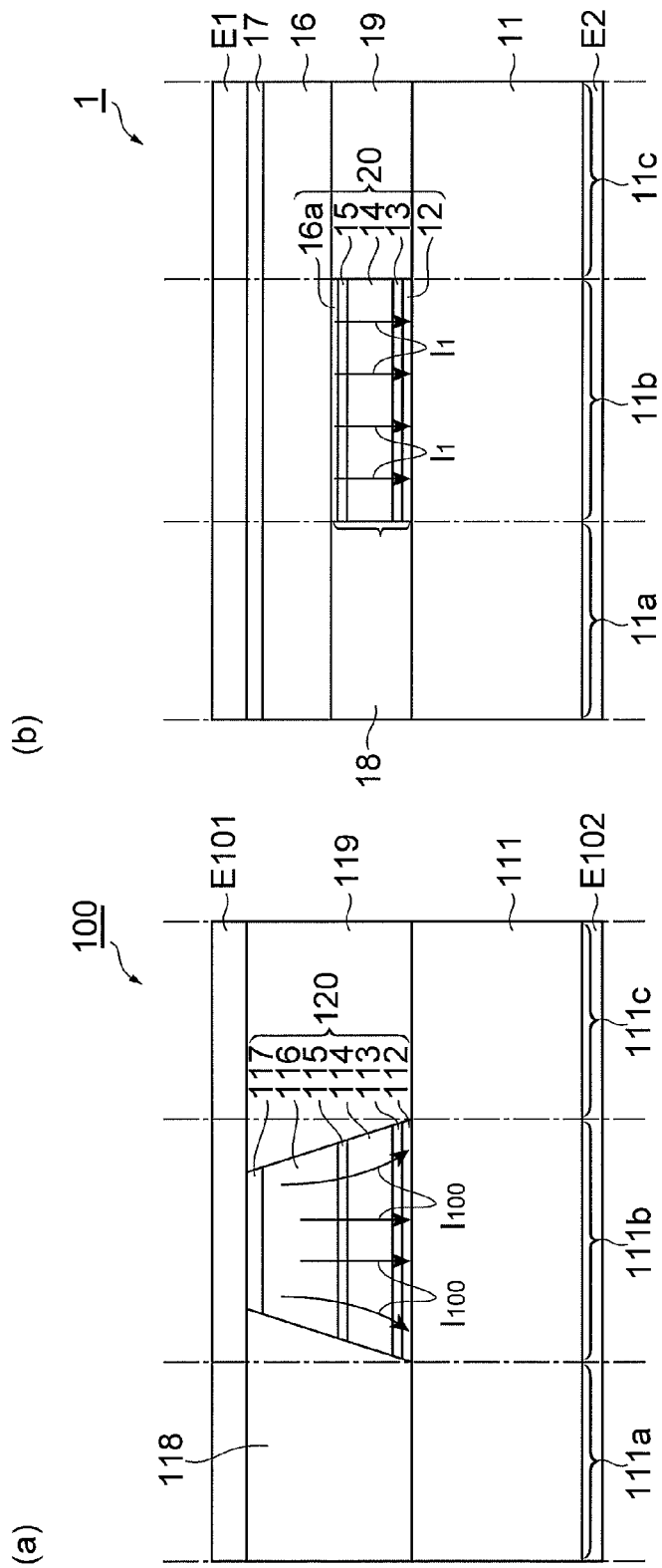
FIG. 6 is (a) a drawing schematically showing the structure of the quantum cascade laser of the comparative example and (b) a drawing schematically showing the structure of the quantum cascade laser shown in FIG. 1.

The below will describe the technical contribution of the quantum cascade laser 1. (a) of FIG. 5 is a drawing schematically showing the mesa structure of a quantum cascade laser 100 according to a comparative example, and (b) a drawing schematically showing the mesa structure of the quantum cascade laser 1. (a) of FIG. 6 is a drawing schematically showing the structure of the quantum cascade laser 100 according to the comparative example, and (b) a drawing schematically showing the structure of the quantum cascade laser 1.

In the quantum cascade laser 100 of the comparative example, a semiconductor lamination including a lower cladding layer 112, a lower optical confinement layer 113, a core layer 114, an upper optical confinement layer 115, an upper cladding layer 116, and a contact layer 117 is grown on a principal surface 111$m$ of a semiconductor substrate 111, and thereafter a dielectric mask M for formation of a mesa stripe section 120 is formed on the contact layer 117 above a second region 111$b$ of the semiconductor substrate 111. Thereafter, as shown in (a) of FIG. 5, the semiconductor lamination on a first region 111$a$ and on a third region 111$c$ not covered by the dielectric mask M is etched down to the principal surface 111$m$ of the semiconductor substrate 111 to form the mesa stripe section 120 on the second region 111$b$.

In the quantum cascade laser herein, the thickness of the core layer is approximately 1 to 2 µm and is larger than the thickness of the core layer in the semiconductor laser device using the pn junction. Furthermore, the thickness of the upper cladding layer is approximately 2 to 4 µm. For this reason, the height of the mesa stripe section 120 in the quantum cascade laser 100 is not less than 5 to 6 µm. When the mesa stripe section 120 having this height is formed by etching, horizontal side etching also becomes greater in addition to vertical etching. Therefore, the cross-sectional shape along the width direction of the mesa stripe section 120 comes to be a shape deviating from a rectangular shape. In the quantum cascade laser 100, as shown in (a) of FIG. 6, a first burying layer 118 and a second burying layer 119 are provided so as to bury the two side faces of the mesa stripe section 120. When a voltage is applied between an upper electrode E101 and a lower electrode E102 with the lower electrode E102 at a higher potential, since the cross-sectional shape along the width direction of the mesa stripe section 120 is a trapezoid shape, an electric current $I_{100}$ of electrons as carriers diffuses widthwise with distance downward from the top along the normal axis NV and comes to flow in a wider core sectional area in the width direction. For this reason, the electric field applied to the core layer 114 is not spatially uniform. Namely, since the width of the upper part of the core layer 114 is different from the width of the lower part thereof, the intensity of the electric field in the core layer 114 differs along the normal axis NV. As described above, when the height of the mesa stripe section is large, the uniformity of the electric field applied to the core layer becomes degraded.

In the quantum cascade laser 1, therefore, the height of the mesa stripe section 20 is reduced to improve the uniformity of the electric field applied to the core layer 14. Namely, the height of the mesa stripe section 20 is decreased by composing the mesa stripe section 20 of the lower cladding layer 12, lower optical confinement layer 13, core layer 14, upper optical confinement layer 15, and cap layer 16a, excluding the upper cladding layer 16 and the contact layer 17. For this reason, the height of the mesa stripe section 20 is, for example, in the range of about 1.5 to 3 µm, which is smaller than the height of the mesa stripe section 120. Therefore, as shown in (b) of FIG. 5, a side etching amount in formation of the mesa stripe section 20 by etching is reduced in the quantum cascade laser 1, when compared to that in the quantum cascade laser 100, and the cross-sectional shape in the width direction of the mesa stripe section 20 is made closer to the rectangular shape than the cross-sectional shape in the width direction of the mesa stripe section 120 is.

In the quantum cascade laser 1 the first burying layer 18 and the second burying layer 19 are provided so as to bury the two side faces of the mesa stripe section 20. These first burying layer 18 and second burying layer 19 include the regions comprised of the semi-insulating semiconductor to trap electrons, and have the high resistance of not less than $10^5$ Ωcm to the electric current of electrons as carriers. Therefore, as shown in (b) of FIG. 6, when a voltage is applied between the upper electrode E1 and the lower electrode E2 with the lower electrode E2 at a higher potential, the electric current $I_1$ of electrons as carriers can be strongly confined in the mesa stripe section 20. Since the cross-sectional shape in the width direction of the mesa stripe section 20 is closer to the rectangular shape than the cross-sectional shape in the width direction of the mesa stripe section 120 is, the diffusion in the width direction of the electric current $I_1$, which can occur with distance downward from the top along the normal axis NV, can be reduced when compared to that in the case of the electric current $I_{100}$. As a consequence, the uniformity of the electric field applied to the core layer 14 is improved in the quantum cascade laser 1, when compared to that in the quantum cascade laser 100.

The semi-insulating semiconductor doped with the transition metal cannot trap holes and does not have a high resistance to holes. For this reason, when the structure of the quantum cascade laser 1 is applied to the semiconductor laser device using the pn junction in which an electric current of holes as carriers (hole current) also flows as well as the electron current, the hole current can pass through the first burying layer 18 and the second burying layer 19. Therefore, the hole current cannot be confined in the mesa stripe section 20 and therefore a large leak current of holes appears outside the mesa stripe section 20. However, since the quantum cascade laser 1 is comprised of only n-type semiconductor layers, there appears only an electric current of electrons as carriers, with no hole current. For this reason, the electric current can be strongly confined in the mesa stripe section 20 in the quantum cascade laser 1, which can improve the lasing property.

Each of the semiconductor layers forming the quantum cascade laser 1 has the lattice constants close to those of InP. For this reason, when the semiconductor substrate 11 is comprised of InP, the semiconductor lamination 10 can be well crystal-grown. Furthermore, InP is a binary mixed crystal and is automatically lattice-matched to the semiconductor substrate comprised of InP. Therefore, by using it for the cladding layers, the lower cladding layer 12 and the upper cladding layer 16 can be grown with good crystallinity on the InP substrate. Furthermore, InP has high thermal conductivity. For this reason, when the lower cladding layer 12 and the upper cladding layer 16 are comprised of InP, heat dissipation from the core layer 14 becomes improved, which can improve the temperature characteristic of the quantum cascade laser 1. When the core layer 14 has the cascade structure in which the plurality of active layers and the plurality of injection layers are alternately arranged, and when each of the active layers and injection layers is composed of the superlattice series comprised of GaInAs and AlInAs, emission of light is achieved in the mid-infrared region by intersubband transitions in the conduction bands in the active layers. When the injection layers are provided between the active layers, electrons are continuously and smoothly transferred between neighboring active layers to efficiently emit photons because of the intersubband transitions in the conduction bands. As a result, the quantum cascade laser 1 achieves good lasing.

FIRST MODIFICATION EXAMPLE

Figure 7:
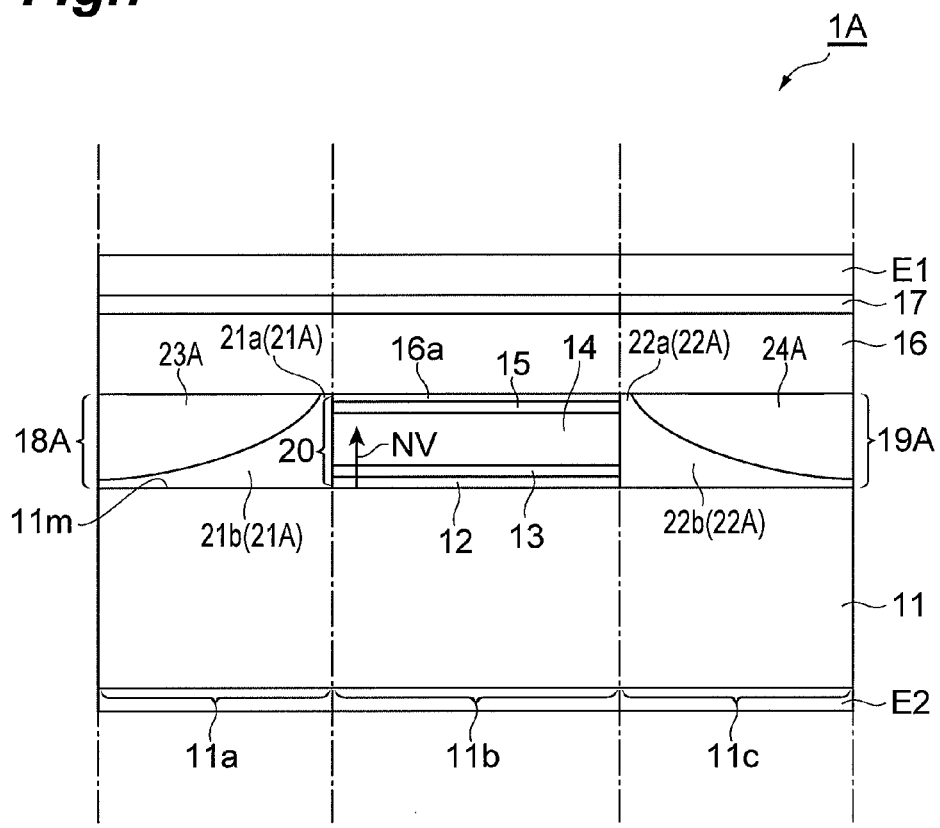
FIG. 7 is a drawing schematically showing a structure of a first modification example of the quantum cascade laser shown in FIG. 1.

The first burying layer 18 and second burying layer 19 have the respective single semi-insulating semiconductor regions in the quantum cascade laser 1, whereas each of the first burying layer 18 and the second burying layer 19 may have a plurality of semi-insulating semiconductor regions. FIG. 7 is a drawing schematically showing a structure in the first modification example of the quantum cascade laser 1. As shown in FIG. 7, the quantum cascade laser 1A is different from the quantum cascade laser 1 in that the quantum cascade laser 1A has a first burying layer 18A and a second burying layer 19A, instead of the first burying layer 18 and the second burying layer 19. The below will describe the first burying layer 18A and the second burying layer 19A. Since the other configuration is the same as in the quantum cascade laser 1, the description thereof is omitted herein.

The first burying layer 18A has a first semi-insulating semiconductor region 21A and a third semi-insulating semiconductor region 23A. The first semi-insulating semiconductor region 21A is laid on the principal surface 11m of the first region 11a and is in contact with the whole of the principal surface 11m of the first region 11a and the whole of one side face of the mesa stripe section 20. Namely, the first semi-insulating semiconductor region 21A has a first side portion 21a including a contact surface between the first burying layer 18A and the core layer 14 and a first bottom portion 21b including a contact surface between the first burying layer 18A and the semiconductor substrate 11. The third semi-insulating semiconductor region 23A is laid on the first semi-insulating semiconductor region 21A so that the height of the first burying layer 18A can be approximately equal to the height of the mesa stripe section 20. It is noted herein that the first bottom portion 21b of the first semi-insulating semiconductor region 21A does not always have to be provided in contact with the semiconductor substrate 11 but may be provided above the semiconductor substrate 11. For example, a buffer layer or the like may be included, for example, between the semiconductor substrate 11 and the first bottom portion 21b.

The second burying layer 19A has a second semi-insulating semiconductor region 22A and a fourth semi-insulating semiconductor region 24A. The second semi-insulating semiconductor region 22A is provided on the principal surface 11m of the third region 11c and is in contact with the whole of the principal surface 11m of the third region 11c and the whole of the other side face of the mesa stripe section 20. Namely, the second semi-insulating semiconductor region 22A has a second side portion 22a including a contact surface between the second burying layer 19A and the core layer 14 and a second bottom portion 22b including a contact surface between the second burying layer 19A and the semiconductor substrate 11. The fourth semi-insulating semiconductor region 24A is laid on the second semi-insulating semiconductor region 22A so that the height of the second burying layer 19A can be approximately equal to the height of the mesa stripe section 20. It is noted herein that the second bottom portion 22b of the second semi-insulating semiconductor region 22A does not always have to be provided in contact with the semiconductor substrate 11 but may be provided above the semiconductor substrate 11. For example, a buffer layer or the like may be included, for example, between the semiconductor substrate 11 and the second bottom portion 22b.

The quantum cascade laser 1A of this configuration also achieves the same technical contribution as the quantum cascade laser 1. Furthermore, in the quantum cascade laser 1A, the first burying layer 18A has the first semi-insulating semiconductor region 21A and, the third semi-insulating semiconductor region 23A comprised of the semi-insulating semiconductor material different from the semi-insulating semiconductor material forming the first semi-insulating semiconductor region 21A, and the second burying layer 19A has the second semi-insulating semiconductor region 22A and, the fourth semi-insulating semiconductor region 24A comprised of the semi-insulating semiconductor material different from the semi-insulating semiconductor material forming the second semi-insulating semiconductor region 22A. For this reason, the first burying layer 18A and the second burying layer 19A can be comprised of a combination of a plurality of semi-insulating semiconductor regions different in properties such as the refractive index, bandgap, and thermal conduction. As a consequence, degrees of freedom for design increase and it becomes feasible to facilitate examination of improvement in characteristics of the quantum cascade laser 1A.

The first semi-insulating semiconductor region 21A and the second semi-insulating semiconductor region 22A are comprised of the semi-insulating semiconductor material. Furthermore, the third semi-insulating semiconductor region 23A and the fourth semi-insulating semiconductor region 24A are comprised of the semi-insulating semiconductor material different from the semi-insulating semiconductor material forming the first semi-insulating semiconductor region 21A and the second semi-insulating semiconductor region 22A. The semi-insulating semiconductor materials to be used are, for example, InP and AlInAs doped with the transition metal such as Fe. With the use of these semiconductor materials, the first semi-insulating semiconductor region 21A, second semi-insulating semiconductor region 22A, third semi-insulating semiconductor region 23A, and fourth semi-insulating semiconductor region 24A come to have the higher resistance to electrons than that to holes and have the high resistance property of not less than $10^5$ Ωcm to the electron current. For this reason, the first burying layer 18A and second burying layer 19A function as current blocking layers against the electron current flowing inside the quantum cascade laser 1A.

As a specific example, preferably, the bandgap of the first semi-insulating semiconductor region 21A is higher than that of the third semi-insulating semiconductor region 23A and the bandgap of the second semi-insulating semiconductor region 22A is higher than that of the fourth semi-insulating semiconductor region 24A. In this case, energy discontinuity increases at conduction band edges between each of the first semi-insulating semiconductor region 21A and the second semi-insulating semiconductor region 22A and each of the neighboring lower cladding layer 12, lower optical confinement layer 13, core layer 14, upper optical confinement layer 15, cap layer 16a, and semiconductor substrate 11, so as to increase energy barriers against electrons. For this reason, entrance of electrons from the neighboring semiconductor layers into the first burying layer 18A and the second burying layer 19A can be further suppressed by the increased energy barriers, in addition to the electron trap effect by deep level. Therefore, the first burying layer 18A and the second burying layer 19A have the much higher resistance to electrons, when compared to the first burying layer 18 and the second burying layer 19. For this reason, when a voltage is applied between the upper electrode E1 and the lower electrode E2 with the lower electrode E2 at a higher potential, the electric current of electrons as carriers can be more strongly confined in the mesa stripe section 20, so as to improve the lasing property.

AlInAs doped with the transition metal is preferably adopted as the high-bandgap semi-insulating material for making up the first semi-insulating semiconductor region 21A and the second semi-insulating semiconductor region 22A. When this AlInAs is doped with the transition metal capable of forming a deep level to trap electrons in the forbidden band, it becomes highly resistive to electrons as in the case of InP. AlInAs has the higher bandgap than InP. Therefore, the use of AlInAs can increase the hetero barriers against electrons, when compared to the case using InP commonly used as the semi-insulating semiconductor material. Since AlInAs is a ternary mixed crystal likely subject to composition variation and includes Al easy to oxidize, growth of a thick film thereof is not easy. The thermal conductivity of AlInAs is smaller by one order of magnitude than that of InP. Therefore, in the first burying layer 18A and the second burying layer 19A, it is preferable to use AlInAs for the first semi-insulating semiconductor region 21A and the second semi-insulating semiconductor region 22A in contact with the neighboring semiconductor layers and to use InP larger in thermal conductivity and easier in crystal growth, for the other third semi-insulating semiconductor region 23A and fourth semi-insulating semiconductor region 24A. In this case, it becomes feasible to achieve improvement in facilitation of manufacture and in temperature characteristic by the increase in thermal conductivity, when compared with the case where the whole burying layers 18A, 19A are comprised of AlInAs.

SECOND MODIFICATION EXAMPLE

Figure 8:
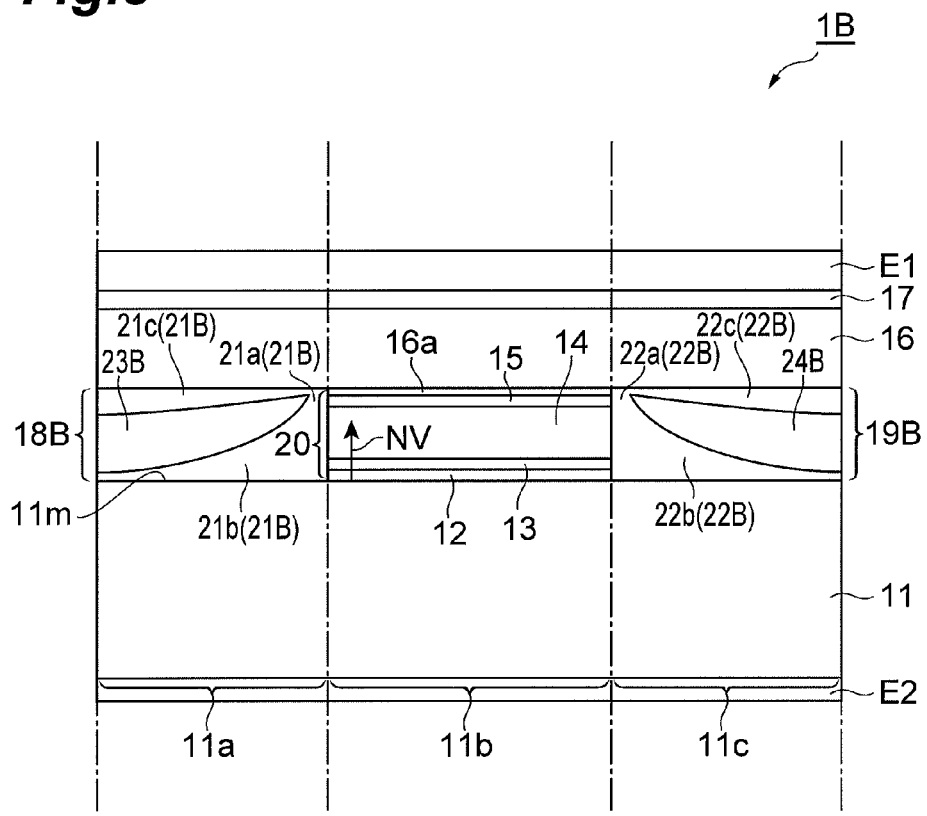
FIG. 8 is a drawing schematically showing a structure of a second modification example of the quantum cascade laser shown in FIG. 1.

FIG. 8 is a drawing schematically showing a structure in the second modification example of the quantum cascade laser 1. As shown in FIG. 8, the quantum cascade laser 1B is different from the quantum cascade laser 1 in that the quantum cascade laser 1B has a first burying layer 18B and a second burying layer 19B, instead of the first burying layer 18 and the second burying layer 19. The below will describe the first burying layer 18B and the second burying layer 19B. Since the other configuration is the same as in the quantum cascade laser 1, the description thereof is omitted herein.

The first burying layer 18B has a first semi-insulating semiconductor region 21B and a third semi-insulating semiconductor region 23B. The first semi-insulating semiconductor region 21B is laid on the principal surface 11m of the first region 11a, and is in contact with the whole of the principal surface 11m of the first region 11a, the whole of one side face of the mesa stripe section 20, and the whole of the back surface of the upper cladding layer 16 above the first region 11a. Namely, the first semi-insulating semiconductor region 21B has a first side portion 21a including a contact surface between the first burying layer 18B and the core layer 14, a first bottom portion 21b including a contact surface between the first burying layer 18B and the semiconductor substrate 11, and a first top portion 21c including a contact surface between the first burying layer 18B and the upper cladding layer 16. The third semi-insulating semiconductor region 23B is provided so as to fill a space surrounded by the first semi-insulating semiconductor region 21B. It is noted that the first bottom portion 21b of the first semi-insulating semiconductor region 21B does not always have to be provided in contact with the semiconductor substrate 11 but may be provided above the semiconductor substrate 11. For example, a buffer layer or the like may be included, for example, between the semiconductor substrate 11 and the first bottom portion 21b.

The second burying layer 19B has a second semi-insulating semiconductor region 22B and a fourth semi-insulating semiconductor region 24B. The second semi-insulating semiconductor region 22B is provided on the principal surface 11m of the third region 11c and is in contact with the whole of the principal surface 11m of the third region 11c, the whole of the other side face of the mesa stripe section 20, and the whole of the back surface of the upper cladding layer 16 above the third region 11c. Namely, the second semi-insulating semiconductor region 22B has a second side portion 22a including a contact surface between the second burying layer 19B and the core layer 14, a second bottom portion 22b including a contact surface between the second burying layer 19B and the semiconductor substrate 11, and a second top portion 22c including a contact surface between the second burying layer 19B and the upper cladding layer 16. The fourth semi-insulating semiconductor region 24B is provided so as to fill a space surrounded by the second semi-insulating semiconductor region 22B. It is noted that the second bottom portion 22b of the second semi-insulating semiconductor region 22B does not always have to be provided in contact with the semiconductor substrate 11 but may be provided above the semiconductor substrate 11. For example, a buffer layer or the like may be included, for example, between the semiconductor substrate 11 and the second bottom portion 22b.

The quantum cascade laser 1B of this configuration also achieves the same technical contribution as the quantum cascade laser 1 and the quantum cascade laser 1A do. Furthermore, in the quantum cascade laser 1B, the first burying layer 18B has the first semi-insulating semiconductor region 21B and, the third semi-insulating semiconductor region 23B comprised of the semi-insulating semiconductor material different from the semi-insulating semiconductor material forming the first semi-insulating semiconductor region 21B, and the second burying layer 19B has the second semi-insulating semiconductor region 22B and, the fourth semi-insulating semiconductor region 24B comprised of the semi-insulating semiconductor material different from the semi-insulating semiconductor material forming the second semi-insulating semiconductor region 22B. For this reason, the first burying layer 18B and the second burying layer 19B can be comprised of a combination of a plurality of semi-insulating semiconductor regions different in properties such as the refractive index, bandgap, and thermal conduction. As a consequence, degrees of freedom for design increase, as in the case of the quantum cascade laser 1A, and it becomes feasible to facilitate examination of improvement in characteristics of the quantum cascade laser 1B.

As an example, the first semi-insulating semiconductor region 21B and the second semi-insulating semiconductor region 22B are comprised of the semi-insulating semiconductor material with a high bandgap, e.g., AlInAs, as the first semi-insulating semiconductor region 21A and the second semi-insulating semiconductor region 22A are. Furthermore, the third semi-insulating semiconductor region 23B and the fourth semi-insulating semiconductor region 24B are comprised of the semi-insulating semiconductor material, e.g., InP, different from the semi-insulating semiconductor material forming the first semi-insulating semiconductor region 21B and the second semi-insulating semiconductor region 22B, as the third semi-insulating semiconductor region 23A and the fourth semi-insulating semiconductor region 24A are. Since these semi-insulating semiconductor materials are the same as those in the first modification example, the description thereof is omitted herein.

In the foregoing quantum cascade laser 1B, the first semi-insulating semiconductor region 21B with the high bandgap is provided on the boundary surfaces to all the semiconductor layers to which the first burying layer 18B is adjacent, and the second semi-insulating semiconductor region 22B with the high bandgap is provided on the boundary surfaces to all the semiconductor layers to which the second burying layer 19B is adjacent. For this reason, the entrance of electrons into the first burying layer 18B and the second burying layer 19B is further suppressed in the quantum cascade laser 1B, when compared to that in the quantum cascade laser 1A.

THIRD MODIFICATION EXAMPLE

Figure 9:
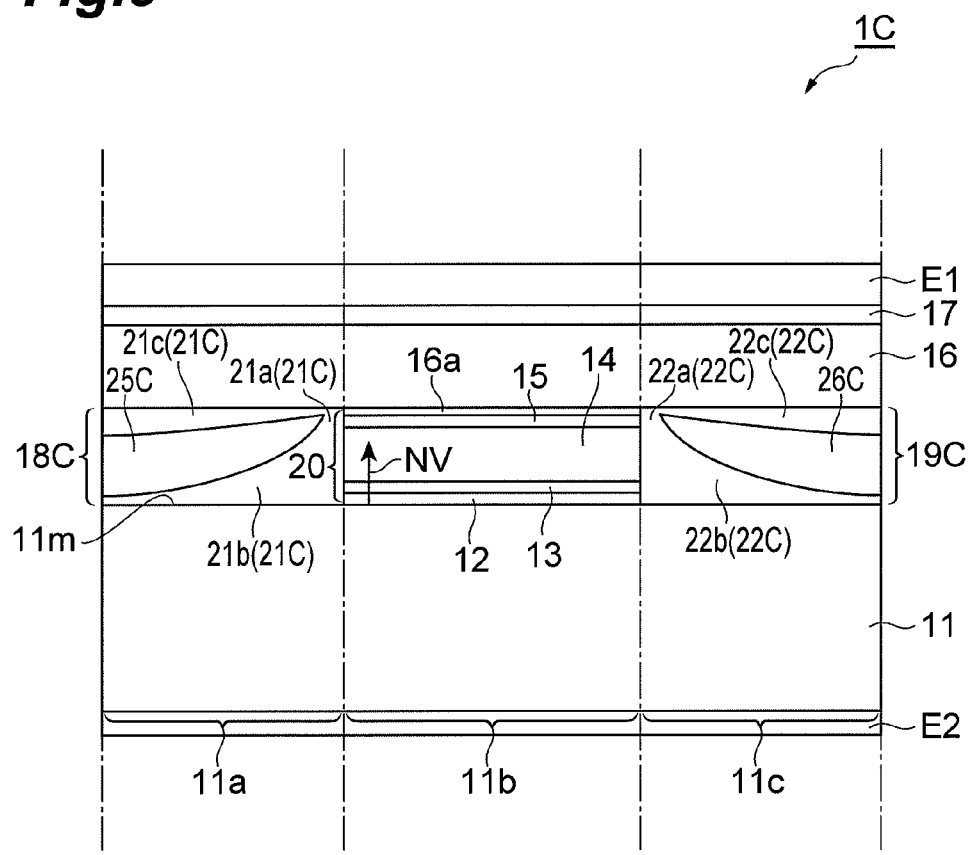
FIG. 9 is a drawing schematically showing a structure of a third modification example of the quantum cascade laser shown in FIG. 1.

In the above embodiment and modification examples the first burying layer and the second burying layer have only the semi-insulating semiconductor regions, but, without having to be limited to this configuration, the first burying layer and the second burying layer may have semiconductor regions except for the semi-insulating regions. FIG. 9 is a drawing schematically showing a structure in the third modification example of the quantum cascade laser 1. As shown in FIG. 9, the quantum cascade laser 1C is different from the quantum cascade laser 1 in that the quantum cascade laser 1C has a first burying layer 18C and a second burying layer 19C, instead of the first burying layer 18 and the second burying layer 19. The below will describe the first burying layer 18C and the second burying layer 19C. Since the other configuration is the same as in the quantum cascade laser 1, the description thereof is omitted herein.

The first burying layer 18C has a first semi-insulating semiconductor region 21C and a first semiconductor region 25C. The first semi-insulating semiconductor region 21C is laid on the principal surface 11m of the first region 11a and is in contact with the whole of the principal surface 11m of the first region 11a, the whole of one side face of the mesa stripe section 20, and the whole of the back surface of the upper cladding layer 16 above the first region 11a. Namely, the first semi-insulating semiconductor region 21C has a first side portion 21a including a contact surface between the first burying layer 18C and the core layer 14, a first bottom portion 21b including a contact surface between the first burying layer 18C and the semiconductor substrate 11, and a first top portion 21c including a contact surface between the first burying layer 18C and the upper cladding layer 16. The first semiconductor region 25C is provided so as to fill a space surrounded by the first semi-insulating semiconductor region 21C. As described above, the first burying layer 18C is a layer obtained by replacing the third semi-insulating semiconductor region 23B of the first burying layer 18B in the quantum cascade laser 1B with the first semiconductor region 25C. A buffer layer or the like may be provided between the semiconductor substrate 11 and the first bottom portion 21b.

The second burying layer 19C has a second semi-insulating semiconductor region 22C and a second semiconductor region 26C. The second semi-insulating semiconductor region 22C is laid on the principal surface 11m of the third region 11c and is in contact with the whole of the principal surface 11m of the third region 11c, the whole of the other side face of the mesa stripe section 20, and the whole of the back surface of the upper cladding layer 16 above the third region 11c. Namely, the second semi-insulating semiconductor region 22C has a second side portion 22a including a contact surface between the second burying layer 19C and the core layer 14, a second bottom portion 22b including a contact surface between the second burying layer 19C and the semiconductor substrate 11, and a second top portion 22c including a contact surface between the second burying layer 19C and the upper cladding layer 16. The second semiconductor region 26C is provided so as to fill a space surrounded by the second semi-insulating semiconductor region 22C. As described above, the second burying layer 19C is a layer obtained by replacing the fourth semi-insulating semiconductor region 24B of the second burying layer 19B in the quantum cascade laser 1B with the second semiconductor region 26C. A buffer layer or the like may be provided between the semiconductor substrate 11 and the second bottom portion 22b.

The first semi-insulating semiconductor region 21C and the second semi-insulating semiconductor region 22C are comprised of the semi-insulating semiconductor material. This semi-insulating semiconductor material to be employed is, for example, InP doped with the transition metal such as Fe. Therefore, the first semi-insulating semiconductor region 21C and the second semi-insulating semiconductor region 22C have the higher resistance to electrons than that to holes and have the high resistance property of not less than $10^5$ Ωcm to the electron current. For this reason, the first burying layer 18C and the second burying layer 19C function as current blocking layers against the electron current flowing inside the quantum cascade laser 1C. The first semiconductor region 25C and the second semiconductor region 26C are comprised of an undoped or n-type semiconductor material. This semiconductor material to be employed is, for example, n-type InP or undoped InP.

The quantum cascade laser 1C of this configuration also achieves the same technical contribution as the quantum cascade laser 1 does. In the mid-infrared region, generally, the optical absorption loss in a semi-insulating semiconductor region comprised of a semi-insulating semiconductor material doped with a transition metal is greater than that in a semiconductor region comprised of an undoped or n-type semiconductor material. For example, in the case of Fe-doped InP which is the most commonly-used semi-insulating semiconductor for current blocking layers, there is a peculiar optical absorption band, for example, in the mid-infrared region of 3-4 μm due to transitions between Fe ion levels formed in InP, and optical absorption tends to become larger than in the case of undoped or n-type InP. Therefore, when the first burying layer 18C and the second burying layer 19C in the quantum cascade laser 1C have the undoped or n-type semiconductor regions, the optical absorption loss is reduced, when compared with that in the case where the first burying layer 18 and the second burying layer 19 have only the semi-insulating semiconductor regions, and it becomes feasible to improve the lasing property of the quantum cascade laser 1C. The undoped semiconductor material has high thermal conductivity. For this reason, when the first semiconductor region 25C and the second semiconductor region 26C are comprised of the undoped semiconductor material, it is feasible to improve heat dissipation from the core layer 14 to the first burying layer 18C and the second burying layer 19C. As a consequence, temperature increase of the core layer 14 is reduced and thus it becomes feasible to improve the temperature characteristic of the quantum cascade laser 1C.

FOURTH MODIFICATION EXAMPLE

Figure 10:
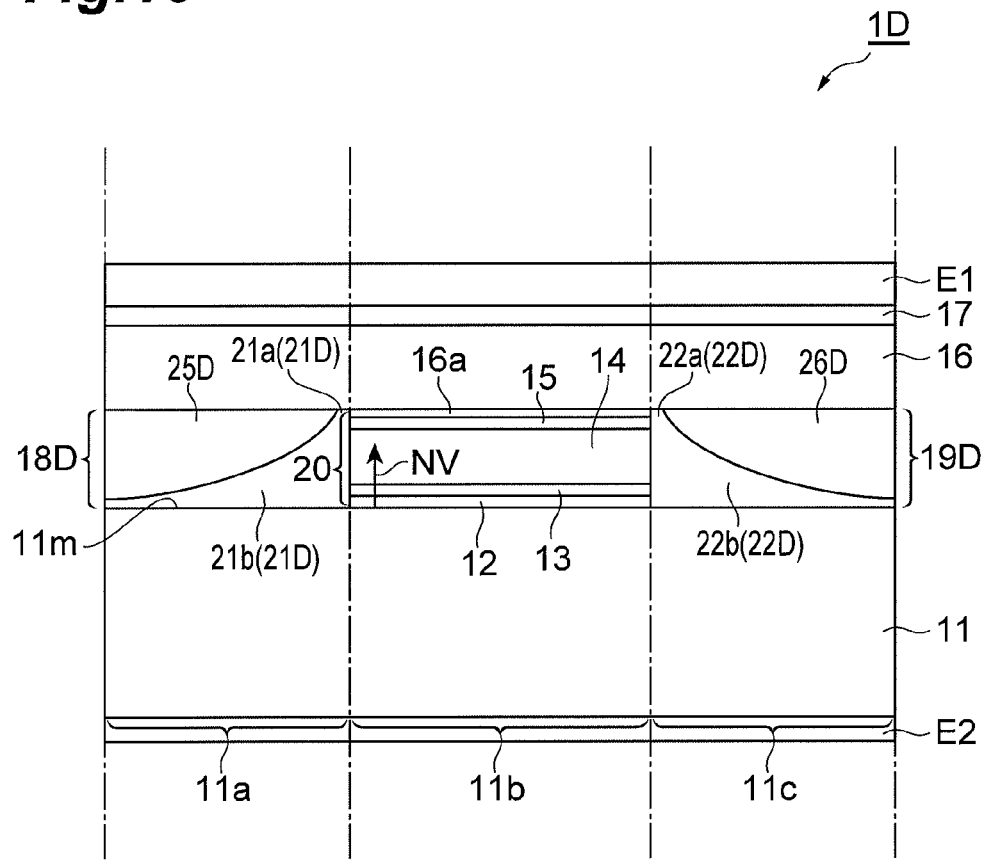
FIG. 10 is a drawing schematically showing a structure of a fourth modification example of the quantum cascade laser shown in FIG. 1.

FIG. 10 is a drawing schematically showing a structure in the fourth modification example of the quantum cascade laser 1. As shown in FIG. 10, the quantum cascade laser 1D is different from the quantum cascade laser 1 in that the quantum cascade laser 1D has a first burying layer 18D and a second burying layer 19D, instead of the first burying layer 18 and the second burying layer 19. The below will describe the first burying layer 18D and the second burying layer 19D. Since the other configuration is the same as in the quantum cascade laser 1, the description thereof is omitted herein.

The first burying layer 18D has a first semi-insulating semiconductor region 21D and a first semiconductor region 25D. The first semi-insulating semiconductor region 21D is laid on the principal surface 11m of the first region 11a and is in contact with the whole of the principal surface 11m of the first region 11a and the whole of one side face of the mesa stripe section 20. Namely, the first semi-insulating semiconductor region 21D has a first side portion 21a including a contact surface between the first burying layer 18D and the core layer 14 and a first bottom portion 21b including a contact surface between the first burying layer 18D and the semiconductor substrate 11. The first semiconductor region 25D is provided on the first semi-insulating semiconductor region 21D so that the height of the first burying layer 18D can be approximately equal to the height of the mesa stripe section 20. As described above, the first burying layer 18D is a layer obtained by replacing the third semi-insulating semiconductor region 23A of the first burying layer 18A in the quantum cascade laser 1A with the first semiconductor region 25D. It is noted that a buffer layer or the like may be provided between the semiconductor substrate 11 and the first bottom portion 21b.

The second burying layer 19D has a second semi-insulating semiconductor region 22D and a second semiconductor region 26D. The second semi-insulating semiconductor region 22D is laid on the principal surface 11m of the third region 11c and is in contact with the whole of the principal surface 11m of the third region 11c and the whole of the other side face of the mesa stripe section 20. Namely, the second semi-insulating semiconductor region 22D has a second side portion 22a including a contact surface between the second burying layer 19D and the core layer 14 and a second bottom portion 22b including a contact surface between the second burying layer 19D and the semiconductor substrate 11. The second semiconductor region 26D is provided on the second semi-insulating semiconductor region 22D so that the height of the second burying layer 19D can be approximately equal to the height of the mesa stripe section 20. As described above, the second burying layer 19D is a layer obtained by replacing the fourth semi-insulating semiconductor region 24A of the second burying layer 19A in the quantum cascade laser 1A with the second semiconductor region 26D. It is noted that a buffer layer or the like may be provided between the semiconductor substrate 11 and the second bottom portion 22b.

The first semi-insulating semiconductor region 21D and the second semi-insulating semiconductor region 22D are comprised of the semi-insulating semiconductor material as the first semi-insulating semiconductor region 21C and the second semi-insulating semiconductor region 22C are. The first semiconductor region 25D and the second semiconductor region 26D are comprised of the undoped or n-type semiconductor material as the first semiconductor region 25C and the second semiconductor region 26C are. Since these semi-insulating semiconductor material and semiconductor material are the same as those in the third modification example, the description thereof is omitted herein.

The quantum cascade laser 1D of this configuration also achieves the same technical contribution as the quantum cascade laser 1 and the quantum cascade laser 1C do. Furthermore, in the quantum cascade laser 1D the semi-insulating semiconductor regions are provided only in the portions necessary for preventing the entrance of electrons into the first burying layer 18D and the second burying layer 19D, and the first semiconductor region 25D and the second semiconductor region 26D are larger than the first semiconductor region 25C and the second semiconductor region 26C. For this reason, the quantum cascade laser 1D can further reduce the optical absorption loss, when compared to the quantum cascade laser 1C, and the quantum cascade laser 1D can further improve the lasing property, when compared to the quantum cascade laser 1C. Similarly, the first semiconductor region 25D and the second semiconductor region 26D are larger than the first semiconductor region 25C and the second semiconductor region 26C, and for this reason, when the first semiconductor region 25D and the second semiconductor region 26D are comprised of the undoped semiconductor material, heat dissipation from the core layer 14 to the first burying layer 18D and the second burying layer 19D can be further improved when compared to that in the quantum cascade laser 1C. As a consequence, the temperature increase in the core layer 14 is further reduced and the temperature characteristic can be further improved in the quantum cascade laser 1D, when compared to that of the quantum cascade laser 1C.

On the other hand, in the quantum cascade laser 1C, the first semi-insulating semiconductor region 21C is provided on the boundary surfaces to all the semiconductor layers to which the first burying layer 18C is adjacent, and the second semi-insulating semiconductor region 22C is provided on the boundary surfaces to all the semiconductor layers to which the second burying layer 19C is adjacent. For this reason, the entrance of electrons into the first burying layer 18C and the second burying layer 19C is further suppressed in the quantum cascade laser 1C, when compared to that in the quantum cascade laser 1D, and thus the current confinement in the mesa stripe section 20 can be more enhanced.

The quantum cascade lasers according to the present invention are not limited to those described in the above embodiment and examples. For example, the mesa stripe section 20 does need to include the core layer 14, but does not always have to include the other semiconductor layers. The above embodiment showed the example wherein the whole of the lower cladding layer 12 was included in the mesa stripe section 20, but without having to be limited to this, for example, a part of the lower cladding layer 12 may be included in the mesa stripe section 20, or the lower cladding layer 12 does not have to be included in the mesa stripe section 20. The above embodiment showed the example wherein the cap layer 16a was included in the mesa stripe section 20, but without having to be limited to this, the cap layer 16a does not have to be included in the mesa stripe section 20. Furthermore, the above embodiment showed the example wherein the semiconductor substrate 11 was not included in the mesa stripe section 20, but a part of the semiconductor substrate 11 including the principal surface 11m side may be included in the mesa stripe section 20.

In the third modification example and the fourth modification example, the first semi-insulating semiconductor regions 21C, 21D and the first semiconductor regions 25C, 25D may be comprised of different types of materials as in the first modification example and the second modification example. The second semi-insulating semiconductor regions 22C, 22D and the second semiconductor regions 26C, 26D may also be comprised of different types of materials. For example, a semi-insulating material with a high bandgap, e.g., AlInAs may be used as the semi-insulating semiconductor material forming the first semi-insulating semiconductor regions 21C, 21D and the second semi-insulating semiconductor regions 22C, 22D. In this case, the first burying layers 18C, 18D and the second burying layers 19C, 19D come to have much higher resistance to electrons as described above, and the electric current can be more strongly confined in the mesa stripe section 20. For this reason, it becomes feasible to improve the lasing property of the quantum cascade lasers 1C, 1D.

As described above, the embodiments of the present invention provide the quantum cascade lasers with the structure capable of improving the uniformity of the electric field applied to the core layer.

What is claimed is:
1. A quantum cascade laser comprising:
a substrate having a conductivity type, the substrate having a principal surface and a back surface opposite to the principal surface, substrate having a first region, a second region, and a third region arranged in order along a direction perpendicular to a normal axis to the principal surface;
a semiconductor lamination provided on the principal surface of the substrate, the semiconductor lamination including a mesa stripe section provided on the second region, an upper cladding layer having the same conductivity type as the substrate, a first burying layer, and a second burying layer, the mesa stripe section including a core layer for emission of light in the quantum cascade laser;
a first electrode provided on the semiconductor lamination; and
a second electrode provided on the back surface of the substrate, wherein
the first burying layer is provided on the first region and one side face of the mesa stripe section,
the second burying layer is provided on the third region and other side face of the mesa stripe section,
the upper cladding layer is provided on the mesa stripe section, the first burying layer, and the second burying layer, the first burying layer includes a first current blocking layer and a third current blocking layer provided on the first current blocking layer, the second burying layer includes a second current blocking layer and a fourth current blocking layer formed on the second current blocking layer, the first current blocking layer has a first side portion in contact with the entire one side face of the mesa stripe section and a first bottom portion provided on the substrate, the second current blocking layer has a second side portion in contact with the entire other side face of the mesa stripe section and a second bottom portion provided on the substrate, the first current blocking layer and the second current blocking layer are comprised of a semiconductor material doped with a transition metal selected from the group consisting of Fe, Ti, Cr, and Co, the first blocking layer has a bandgap energy higher than a bandgap energy of the third current blocking layer, the second current blocking layer has a bandgap energy higher than a bandgap energy of the fourth current blocking layer, and the first and second current blocking layers have a larger band gap energy than that of the upper cladding layer.

2. The quantum cascade laser according to claim 1, wherein the first burying layer further has a first semiconductor region comprised of an undoped or n-type semiconductor material, and the second burying layer further has a second semiconductor region comprised of an undoped or n-type semiconductor material.

3. The quantum cascade laser according to claim 2, wherein the first current blocking layer has a bandgap energy higher than a bandgap energy of the first semiconductor region, and the second current blocking layer has a bandgap energy higher than a bandgap of the second semiconductor region.

4. The quantum cascade laser according to claim 1, wherein the first current blocking layer and the second current blocking layer have a higher resistance to electrons than to holes.

5. The quantum cascade laser according to claim 1, wherein the first current blocking layer and the second current blocking layer are comprised of InP or AlInAs.

6. The quantum cascade laser according to claim 1, wherein the core layer has a plurality of active layers and a plurality of injection layers to inject carries into the active layers, the active layers and the injection layers being alternately arranged.

7. The quantum cascade laser according to claim 6, wherein each of the active layers and the injection layers is comprised of a superlattice series of GaInAs and AlInAs.

8. The quantum cascade laser according to claim 1, wherein the upper cladding layer is comprised of InP with the conductivity type of n-type.

9. The quantum cascade laser according to claim 1, wherein the substrate is comprised of InP with the conductivity type of n-type.

10. The quantum cascade laser according to claim 1, wherein the third and fourth current blocking layers are comprised of a semiconductor material doped with a transition metal selected from the group consisting of Fe, Ti, Cr, and Co, and un-doped semiconductor material, or an n-type semiconductor material.

* * * * *